(12) United States Patent
Chen et al.

(10) Patent No.: US 11,056,480 B2
(45) Date of Patent: Jul. 6, 2021

(54) METHOD OF FORMING A TVS SEMICONDUCTOR DEVICE

(71) Applicant: SEMICONDUCTOR COMPONENTS INDUSTRIES, LLC, Phoenix, AZ (US)

(72) Inventors: Yupeng Chen, San Jose, CA (US); Steven M. Etter, Phoenix, AZ (US); Umesh Sharma, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/704,365

(22) Filed: Dec. 5, 2019

(65) Prior Publication Data

US 2020/0111777 A1 Apr. 9, 2020

Related U.S. Application Data

(63) Continuation of application No. 15/684,556, filed on Aug. 23, 2017, now Pat. No. 10,535,648.

(51) Int. Cl.
*H01L 27/02* (2006.01)
*H01L 27/06* (2006.01)
*H01L 29/732* (2006.01)
*H01L 29/861* (2006.01)
*H01L 29/08* (2006.01)
*H01L 23/535* (2006.01)
*H01L 29/66* (2006.01)
*H01L 29/06* (2006.01)
*H01L 29/10* (2006.01)

(52) U.S. Cl.
CPC ........ *H01L 27/0248* (2013.01); *H01L 23/535* (2013.01); *H01L 27/0255* (2013.01); *H01L 27/0259* (2013.01); *H01L 27/0664* (2013.01); *H01L 29/0804* (2013.01); *H01L 29/0821* (2013.01); *H01L 29/66136* (2013.01); *H01L 29/66234* (2013.01); *H01L 29/7322* (2013.01); *H01L 29/861* (2013.01); *H01L 29/8611* (2013.01); *H01L 29/0638* (2013.01); *H01L 29/0649* (2013.01); *H01L 29/0692* (2013.01); *H01L 29/1004* (2013.01); *H01L 29/732* (2013.01); *H01L 29/8613* (2013.01)

(58) Field of Classification Search
None
See application file for complete search history.

(56) References Cited

U.S. PATENT DOCUMENTS

| | | | |
|---|---|---|---|
| 5,644,460 | A | 7/1997 | Clukey |
| 6,015,999 | A | 1/2000 | Yu et al. |
| 6,489,660 | B1 | 12/2002 | Einthoven et al. |
| 7,568,395 | B2 | 5/2009 | Keena et al. |
| 7,579,632 | B2 | 8/2009 | Salih et al. |
| 7,812,367 | B2 | 10/2010 | Salih et al. |
| 8,232,601 | B1 | 7/2012 | Lin et al. |
| 8,552,530 | B2 | 10/2013 | Lin et al. |
| 8,817,437 | B2 | 8/2014 | Peng et al. |
| 9,337,178 | B2 * | 5/2016 | Marreiro ............ H01L 27/0248 |

(Continued)

*Primary Examiner* — Andres Munoz
(74) *Attorney, Agent, or Firm* — Robert F. Hightower

(57) ABSTRACT

In one embodiment, a TVS semiconductor device includes a P-N diode that is connected in parallel with a bipolar transistor wherein a breakdown voltage of the bipolar transistor is less than a breakdown voltage of the P-N diode.

10 Claims, 3 Drawing Sheets

(56) References Cited

U.S. PATENT DOCUMENTS

| | | |
|---|---|---|
| 9,431,385 B2 | 8/2016 | Chen et al. |
| 9,438,034 B2 | 9/2016 | Chen |
| 2003/0168701 A1 | 9/2003 | Voldman |
| 2009/0045457 A1 | 2/2009 | Bobde |
| 2009/0050970 A1 | 2/2009 | Schneider et al. |
| 2012/0025350 A1 | 2/2012 | Lin et al. |
| 2013/0075866 A1 | 3/2013 | Otake et al. |
| 2013/0147419 A1 | 6/2013 | Sakai et al. |
| 2014/0159108 A1 | 6/2014 | Marreiro et al. |
| 2015/0041954 A1 | 2/2015 | Chen et al. |
| 2017/0012035 A1 | 1/2017 | Davis |
| 2017/0077082 A1* | 3/2017 | Marreiro ............ H01L 27/0262 |
| 2017/0345811 A1 | 11/2017 | Yin et al. |
| 2018/0047717 A1 | 2/2018 | Wang et al. |

* cited by examiner

METHOD OF FORMING A TVS SEMICONDUCTOR DEVICE

This Application is a continuation application of patent application Ser. No. 15/684,556 filed on Aug. 23, 2017, which is hereby incorporated herein by reference, and priority thereto is hereby claimed.

BACKGROUND OF THE INVENTION

The present invention relates, in general, to electronics, and more particularly, to semiconductors, structures thereof, and methods of forming semiconductor devices.

In the past, the electronics industry often utilized a transient voltage suppressor (TVS) to protect electronic devices or electronic equipment that were interconnected by connections, such as wiring or cables, between the devices. The connection may be a power connection or wires that were between a charger and another device such as a cell phone or between other types of equipment or devices, or the connection may be a data line or data connection between two pieces of equipment or devices such as between two computers or a camera and a computer or a cell phone and a computer, etc.

The TVS devices generally were implemented as a Zener diode that was connected between the connection, such as between the wiring or cable, and a common return voltage such as ground or other common reference voltage. In some applications, the TVS device did not have a low enough clamp voltage to sufficiently protect the electronic device or equipment. Additionally, in some applications the equipment or device may be subjected to a transient voltage that was high enough to damage the TVS device.

Accordingly, it is desirable to have a TVS device that has a lower clamp voltage, or that can survive larger transient events or voltage therefrom.

Figure 1:
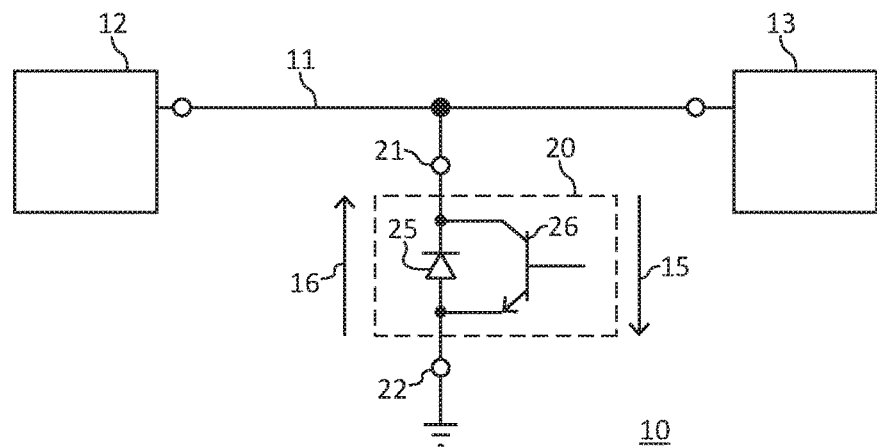
FIG. 1 schematically illustrates an example of an embodiment of a portion of a system that includes a TVS in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

The embodiments illustrated and described hereinafter suitably may have embodiments and/or may be practiced in the absence of any element which is not specifically disclosed herein.

DETAILED DESCRIPTION OF THE DRAWINGS

FIG. 1 schematically illustrates an example of an embodiment of a portion of a system 10 that has a connection 11, such as a conductor or a plurality of conductors, that provides electrical connections between two electronic devices 12 and 13. System 10 includes a transient voltage suppressor (TVS) 20 that has a low forward or positive clamp voltage. TVS 20 has an I/O terminal 21 that may be connected to connection 11, and a common terminal 22 that may be connected to a common return voltage such as for example a ground or other common return voltage. TVS 20 includes a P-N or junction diode 25 having an anode connected to terminal 22 and a cathode connected to terminal 21. TVS 20 also includes a bipolar transistor 26 and has diode 25 connected in parallel with transistor 26. In an embodiment, diode 25 may be connected between a collector and an emitter of transistor 26. An embodiment may include that transistor 26 may be an NPN transistor but, as will be seen further hereinafter, may be a PNP transistor in other embodiments. Transistor 26 may be configured such that the collector of transistor 26 is directly connected to the cathode of diode 25 and the emitter is directly connected to the anode of diode 25. Transistor 26 is configured with the base electrode or a base connection or a base region of transistor 26 floating and not directly connected to any elements or voltage, such as for example not connected to a potential external to TVS 20 or alternately external to transistor 26.

An embodiment of transistor 26 may be configured to have an open base collector-emitter breakdown voltage (BVeco) that is less than a reverse breakdown voltage of diode 25. An embodiment of diode 25 has a forward voltage that is substantially a P-N junction forward voltage. In an example embodiment, the P-N diode forward voltage may be near approximately 0.7 V.

TVS 20 may be configured so that the normal operating voltage or working voltage for the signals or voltages on connection 11 are less than the positive or forward clamp voltage of TVS 20. Thus, for the range of working voltages, TVS 20 does not turn on or clamp connection 11 to a voltage. Those skilled in the art will appreciate that TVS 20 has a positive clamp voltage at which TVS 20 begins to conduct a current 15 from terminal 21, through TVS 20, to terminal 22. For low values of current 15, such as for example values less than a few milli-amperes (for example less than 10-100 ma.), TVS 20 holds terminal 21 to that clamp voltage. As the current increases, the clamp voltage may also slightly increase but is still less than that of prior TVS devices when both are compared at the same current value.

In the event that a positive voltage is applied to connection 11 such that the voltage of connection 11 is positive relative to the common voltage applied to terminal 22 and is greater than the positive clamp voltage of TVS 20, or alternately greater than the BVeco voltage of transistor 26, (as referenced to terminal 22) transistor 26 turns-on and current 15 flows from terminal 21 through transistor 26 from the collector to the emitter and out terminal 22. In an embodiment, the BVeco voltage of transistor 26 may form the positive clamp voltage of TVS 20. If the current continues to increase, diode 25 may also eventually breakdown and conduct some of the transient current. In the event that a negative voltage is applied to connection 11 such that the voltage of connection 11 is less than the common voltage applied to terminal 22 and is less by an amount (in magnitude) more than the negative clamp voltage of TVS 20, current 16 flows from terminal 22 through diode 25 to terminal 21 and to the voltage applied to connection 11. An embodiment may include that the forward voltage of diode 25 forms the reverse or negative clamp voltage of TVS 20. If current 16 continues to increases, the clamp voltage may also increase. At higher current values, transistor 26 may also breakdown, such as the BVceo breakdown, and some of current 16 may also flow from the emitter to the collector through transistor 26.

Figure 2:
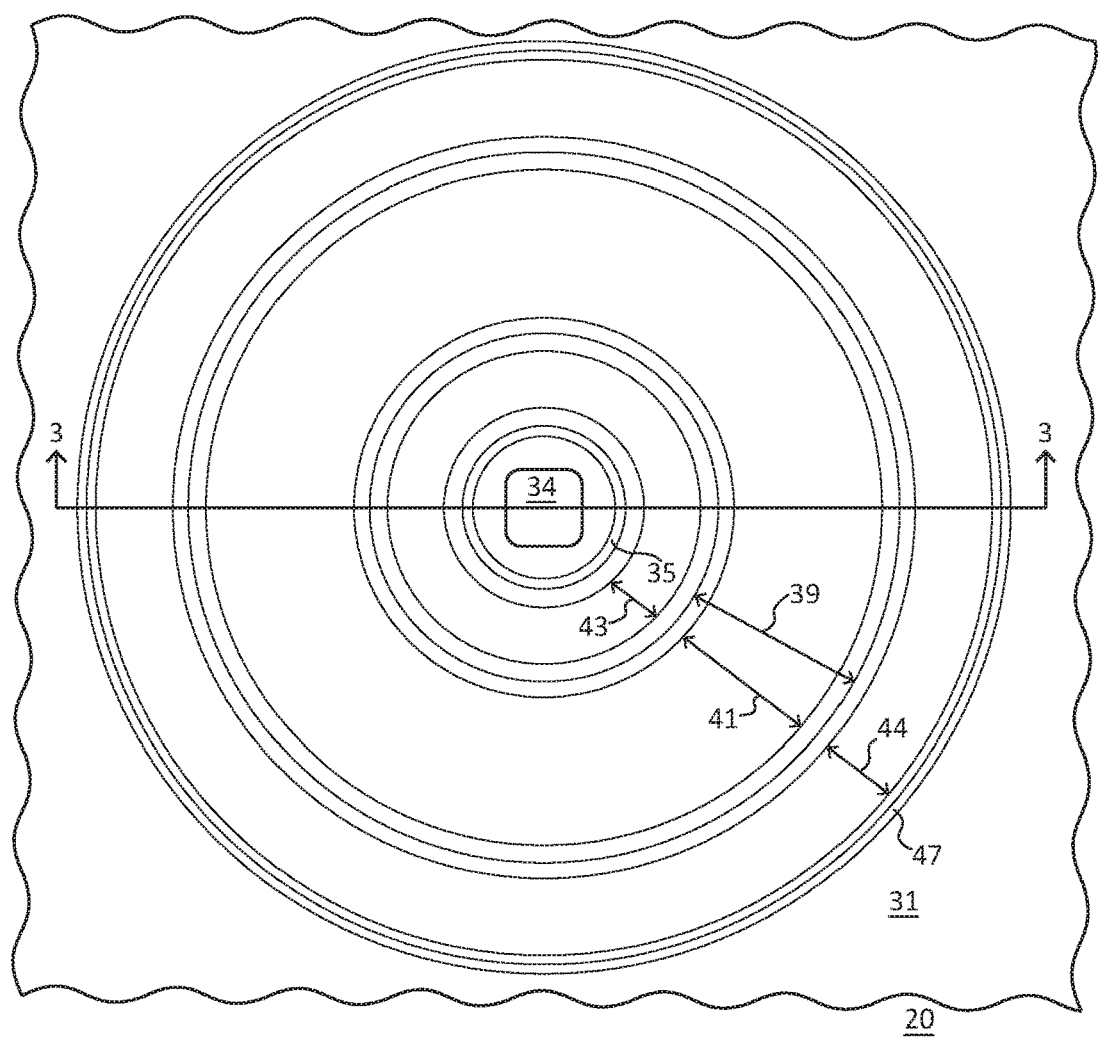
FIG. 2 illustrates an enlarged plan view of an example of an embodiment of a portion of the TVS of FIG. 1 in accordance with the present invention.

FIG. 2 illustrates an enlarged plan view of an example of an embodiment of a portion of TVS 20.

Figure 3:
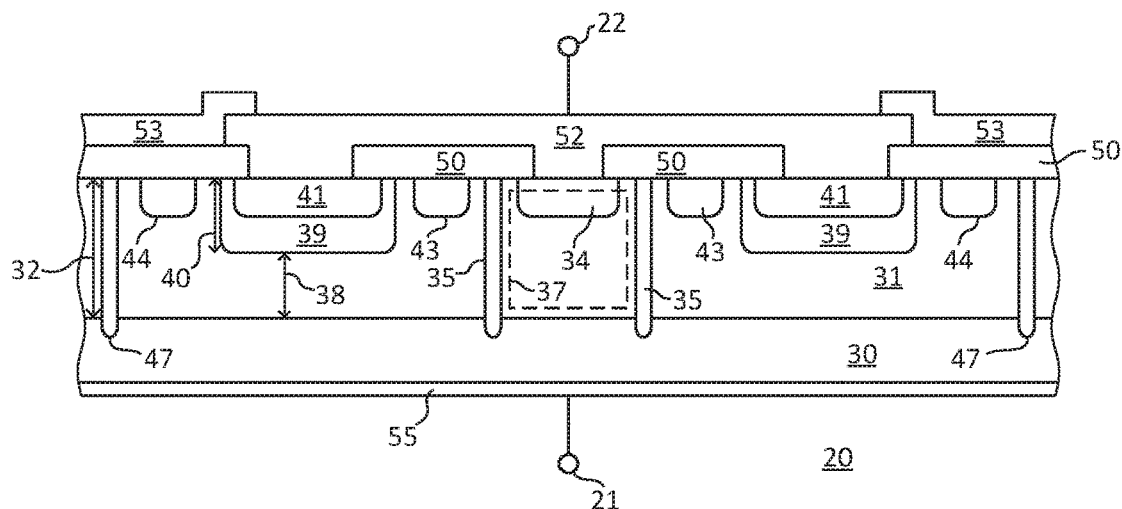
FIG. 3 illustrates an enlarged cross-sectional view of the TVS of FIG. 2 in accordance with the present invention.

FIG. 3 illustrates an enlarged cross-sectional view of TVS 20 along cross-section line 3-3 of FIG. 2. This description has references to FIG. 1-FIG. 3.

TVS 20 is formed on a semiconductor substrate 30. A semiconductor region 31 is formed on a first surface of substrate 30. Region 31 may be formed by epitaxial methods or may be a doped region of substrate 30, or may have other embodiments. Region 31 may be formed to have a thickness that forms a distance 32 such that a first surface of region 31 that is opposite to substrate 30 is spaced distance 32 from the surface of substrate 30. An isolation structure 35 is formed to surround a portion 37, illustrated in a general manner by a dashed box, of region 31. Structure 35 electrically isolates portion 37 from other portions of region 31 and prevents lateral current flow through region 31 from portion 37 laterally to other portions of region 31. Structure 35 may be formed as trenches that extend from the first surface of region 31, through region 31 and at least touch or alternately extend into substrate 30. Structure 35 may be formed as oxide filled trenches or trenches having oxide liners or other various embodiments that provide the electrical isolation between portion 37 and other portions of region 31. A semiconductor region 34 may be formed within portion 37 to extend from the surface of region 31 a distance into region 31. In an embodiment, region 34 may be a contact region that provides a low resistance contact to portion 37, thus, region 34 may have the same conductivity type as region 31 and may have a higher doping concentration. In an embodiment, the interface between portion 37 of region 31 and the underlying portion of substrate 30 may function to form diode 25. An embodiment may include that substrate 30 may form the cathode of diode 25 and portion 37 of region 31 may form the anode of diode 25. In an embodiment, the reverse breakdown voltage of diode 25 is controlled by the doping concentration of substrate 30 and of portion 37. In an embodiment, region 31 has a lower doping concentration than substrate 30. An embodiment of diode 25 and transistor 26 may both use a P-N junction formed between substrate 30 and region 31, which assists in forming the positive breakdown voltage of transistor 26 to be less than the reverse breakdown voltage of diode 25.

Another isolation structure 47 may be formed to surround a second portion of region 31, such as for example the portion of region 31 between structure 35 and structure 47. Structure 47 may be formed similarly to structure 35. An embodiment of TVS 20 may include that transistor 26 may be formed within the second portion of region 31. A second semiconductor region 39 may be formed within the second portion of region 31 and may extend from the first surface of region 31 a distance 40 into the second portion of region 31. The maximum excursion of region 39 typically is spaced a distance 38 from the surface of substrate 30 so that portions of region 31 underlie region 39 and separate region 39 from substrate 30. Another semiconductor region 41 may be formed within region 39 and extend from the first surface of region 31 a distance into region 39 that is less than distance 40. An embodiment may include that region 41 may be formed to provide a low resistance electrical connection between region 39 and a conductor, thus, may have a higher doping concentration than region 39. In an embodiment, the portion of substrate 30 that electrically contacts the second portion of region 31 may form the collector of transistor 26, region 39 may form the emitter of transistor 26, and at least a portion of region 31 that is underlying region 39 may form the base, or a portion of the base, of transistor 26.

TVS 20 may also include optional surface inversion prevention regions 43 and 44 that are formed within the second portion of region 31 and extend from the first surface of region 31 a distance into region 31 that is less than distance 40. Optional regions 43 and 44 are spaced laterally apart from region 39 such that region 39 is positioned between regions 43 and 44. Regions 43 and 44 have the same conductivity type as region 31 but a higher doping concentration. Regions 43 and 44 are floating and are not connected to an electrical potential or source of voltage that is external to TVS 20. Regions 43 and 44 assist in preventing inversion at the surface of region 31.

A conductor 52 may be formed to physically and electrically connect to regions 34 and 39 (through region 41) to provide an electrical connection between transistor 26 and diode 25. In an embodiment, conductor 52 provides an electrical connection between the anode of diode 25 and the emitter of transistor 26. Conductor 52 may be connected to terminal 22. A conductor 55 may be formed on at least a portion of the second surface of substrate 30 to provide an electrical connection to substrate 30 and may form an electrical connection to the cathode of diode 25 and to the collector of transistor 26. Conductor 55 may be connected to terminal 21.

An insulator 50 may be formed on the surface of region 31 with openings in insulator 50 overlying regions 34 and 41 to allow for the electrical connection to conductor 52. In some embodiments, another insulator 53 may be formed overlying insulator 50 and at least the edges of conductor 52 to provide further electrical insulation.

Referring to FIG. 2, TVS 20 is illustrated without conductor 52 and insulators 50 and 53 in order to illustrate an example of a topology for at least some of the doped regions of TVS 20. In an embodiment, regions 39, 41, 43-44, and structures 35 and 47 are formed as multiply-connected domains with region 34 positioned near an approximate center of one on the domains. Those skilled in the art will understand that "multiply-connected topology" or "multiply-connected" means a class of connected shape(s) or domain(s) that have an opening or hole through the shape, such as for example a doughnut having a doughnut hole through the middle of the doughnut. Although the periphery of the shapes of the domains are illustrated as circles, the domains may have various other shapes such as square, oval, rectangular, or irregular, or any other shape.

Referring back to FIG. 3, the doping concentration of region 31 and distance 32 can be adjusted to provide a desired value for the forward breakdown voltage of TVS 20, or alternately the BVeco of transistor 26 or the positive clamp voltage of TVS 20. An embodiment may include that distance 32 may be selected so that distance 38 is sufficiently large enough so that the depletion region formed during the positive transient event does not extend to intersect substrate 30.

In one example embodiment, TVS 20 may be formed to have a working voltage of up to four and one-half volts (4.5V) and a positive clamp voltage, at low current levels, of approximately five and one half volts (5.5 V). In this example embodiment, substrate 30 may have an N-type conductivity, region 31 may have P-type conductivity, regions 39 and 41 may have N-type conductivity, and regions 34, 43, and 44 may have P-type conductivity. Substrate 30 may have a high doping concentration that may be greater than any of regions 31, 39, or 41. In an example embodiment, the doping concentration of region 31 may be set to a particular value and distance 32 may be changed to provide different positive clamp voltages for TVS 20. For example, in order to provide the approximately five and one-half volt (5.5V) positive clamp voltage, region 39 may be formed to have a doping concentration of approximately 1E17 to approximately 1E18 atoms/cm$^3$ and preferably may be approximately 5E17 atoms/cm$^3$, region 31 may have a P-type doping concentration in the range of approximately 1E17 to approximately 1E18 atoms/cm$^3$ and preferably may be approximately 1E18 atoms/cm$^3$, distance 32 may be formed to be approximately six microns (6μ) to approximately eight microns (8μ) and preferably may be approximately seven microns (7μ).

In another example embodiment, the working voltage may be approximately six volts (6V) and the positive clamp voltage of TVS 20 may be selected to be approximately seven volts (7 V). The doping concentration of all of the regions of TVS 20 may remain substantially the same as in the previous example and only the value of distance 32 may be increased to be within the range of approximately eleven microns (11μ) to approximately thirteen microns (13μ), or may preferably be approximately twelve microns (12μ).

Figure 4:
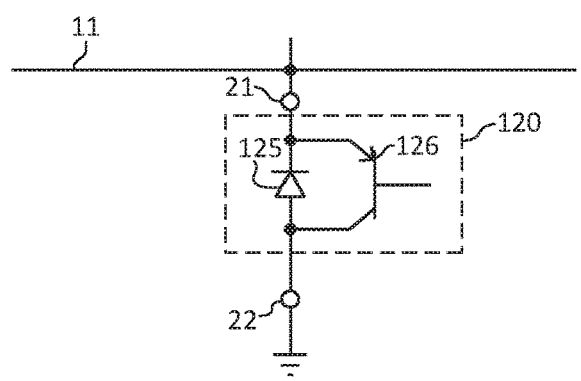
FIG. 4 schematically illustrates an example of an embodiment of a portion of another TVS that may be an alternate embodiment of the TVS of FIGS. 1-3 in accordance with the present invention.

FIG. 4 schematically illustrates an example of an embodiment of a portion of a TVS 120 that may have an embodiment that may be an alternate embodiment of TVS 20. TVS 120 is substantially the same as TVS 20 except that transistor 126 is a PNP transistor instead of an NPN transistor. A diode 125 is substantially the same as diode 25 except that diode 125 is connected in parallel between an emitter and a collector of transistor 126. The base of transistor 126 is floating in substantially the same conditions as the base of transistor 26.

Figure 5:
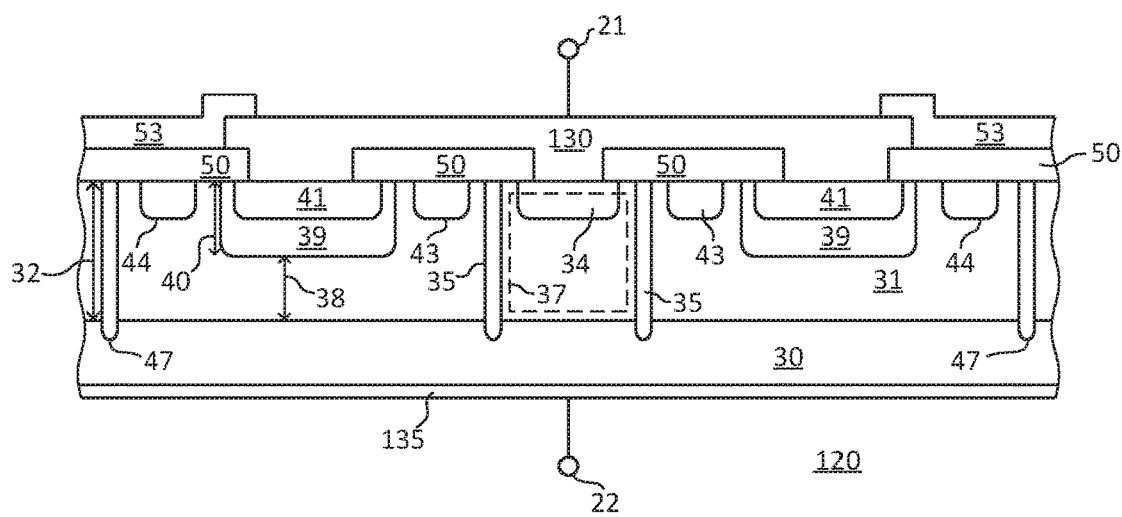
FIG. 5 illustrates an enlarged cross-sectional view of an example of an embodiment of a portion the TVS of FIG. 4 in accordance with the present invention.

FIG. 5 illustrates an enlarged cross-sectional view of an example of an embodiment of a portion of TVS 120. This description has references to FIG. 1-FIG. 5. TVS 120 is substantially the same as TVS 20 except that the conductivity type of all of the regions and elements of TVS 120 is the opposite conductivity type to the corresponding elements and regions of TVS 20. In an embodiment of TVS 120, substrate 30 may be P-type, regions 31, 34, 43, and 44 may have N-type conductivity, and regions 39 and 41 may have P-type conductivity. Because of the lower mobility of holes in the P-type portions of TVS 120, the positive clamp voltage of TVS 120 may be higher than the positive clamp voltage of TVS 20 for the same value of distance 32. Also the BVeco of transistor 126 may be higher.

In one example embodiment, TVS 120 was formed to operate with a working voltage of approximately twenty six and one-half volts (26.5V) and to have a positive clamp voltage of approximately thirty volts (30V), at low current levels. For this example, region 31 may have a doping concentration of approximately 1E16 atoms/cm$^3$ to approximately 5E16 atoms/cm$^3$, and preferably approximately 3E16 atoms/cm$^3$, and region 39 may have a doping concentration of approximately 1E17 to approximately 1E18 atoms/cm$^3$. In this example embodiment, distance 32 may be formed to be approximately twenty three microns (23μ) to approximately twenty five microns (25μ), and may preferably be approximately twenty four microns (24μ). Distance 38 may be formed to be approximately fifteen microns to approximately nineteen microns (15μ-19μ).

Figure 6:
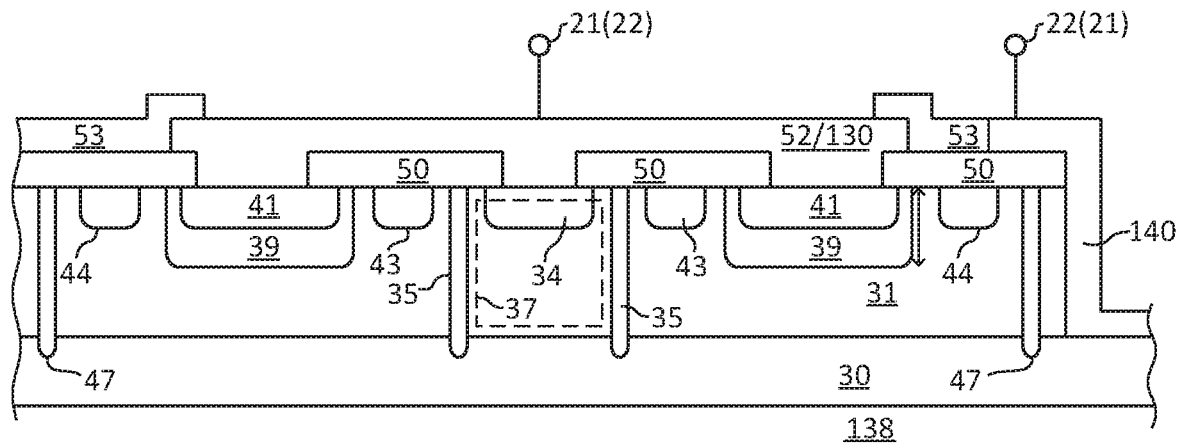
FIG. 6 illustrates an enlarged cross-sectional view of an example of an embodiment of a portion of another TVS that may have an embodiment that may be an alternate embodiment of the TVS of any of FIGS. 1-5 in accordance with the present invention.

FIG. 6 illustrates an enlarged cross-sectional view an example of an embodiment of a portion of a TVS 138 that may have an embodiment that may be an alternate embodiment of either of TVS 20 or TVS 120. TVS 138 includes a deep conductor 140 that is formed to make an electrical connection to substrate 30 and to also extend onto the top surface of TVS 138, such as for example on top of insulator 50. This facilitates connecting both of terminals 21 and 22 to the top surface of TVS 138 instead of connection one of the terminals to a bottom surface or the second surface of substrate 30.

For the example embodiment where TVS 138 may be TVS 20 that has conductor 140, conductor 140 forms an electrical connection to substrate 30 thus forming the electrical connection to the collector of transistor 26 and to the cathode of diode 25. Thus, TVS 138 no longer requires conductor 55 (FIG. 3) to form the connection on the bottom surface of substrate 30. Although, conductor 55 may be also be retained in some optional embodiments. Conductor 140 allows forming a connection to substrate 30 on the top surface of the TVS as illustrated by TVS 138. Thus both terminals 21 and 22 can be connected to the top surface of TVS 138. This facilitates packaging a TVS that has conductor 140 in a chip scale package that only allows connections to one surface of a semiconductor device. The references in FIG. 6 to terminals 21(22), and 22(21), and conductors 52/130 illustrate that in the example embodiment of TVS 138 being an alternate to TVS 20 the conductor would be conductor 52 and be connected to terminal 21 and that conductor 140 would be connected to terminal 22. However, in the alternate embodiment of TVS 138 been an example of TVS 120, the top conductor would be conductor 130 instead of 52 and would be connected to terminal 22, and conductor 140 would be connected to terminal 21.

Figure 7:
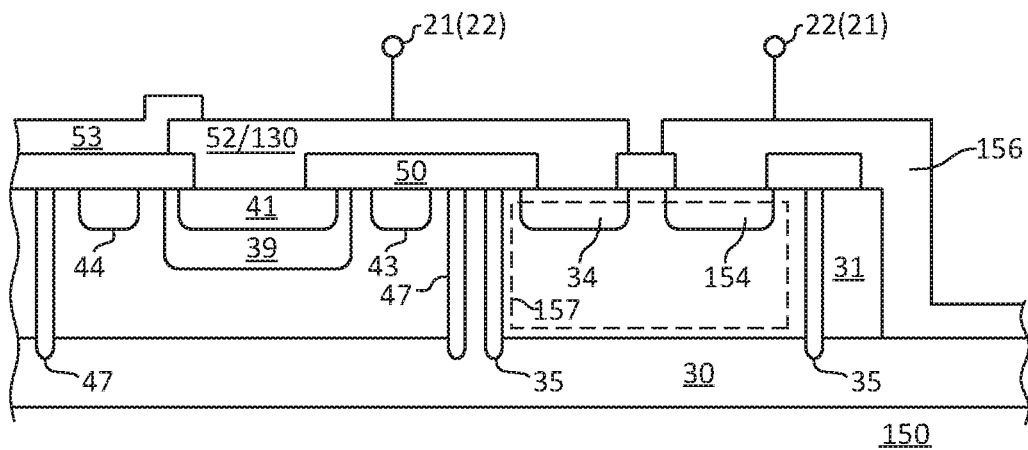
FIG. 7 illustrates an enlarged cross-sectional view of an example of an embodiment of a portion of another TVS that may have an embodiment that may be an alternate embodiment of the TVS of any of FIGS. 1-6 in accordance with the present invention.

FIG. 7 illustrates a cross-sectional view of an example of an embodiment of a portion of a TVS 150 that also may be an alternate embodiment of either of TVS 20 or TVS 120. TVS 150 is formed such that diode 25 (or alternately diode 125) is formed as a lateral diode instead of a vertical diode. Thus, isolation structure 35 surrounds a portion 157, illustrated in a general manner by a dashed box, of region 31 that is larger than portion 37. Region 34 is formed within portion 157. TVS 150 also includes a semiconductor region 154 that is also formed in portion 157. Region 154 extends from the surface of region 31 a distance into region 31. Region 154 is formed to have the opposite conductivity type to region 34 so that region 154 and portion 157 of region 31 form the P-N junction for the diode that is connected in parallel with the transistor of the TVS device. In one embodiment the diode may be diode 25 of TVS 20 or in another embodiment may be diode 125 of TVS 120. In an embodiment, transistor 26 or alternately 126 may not be formed as a multiply-connected domain but may be formed with other topologies. For example, may be formed as a stripe or with a rectangular or square topology or with other geometric topologies. In an embodiment, structure 47 also may not be formed as a multiply connected domain but may be formed to surround the portion of region 31 in which transistor 26 or 126 may be formed.

TVS 150 may optionally also includes a deep conductor 156 that is similar to conductor 140. However, conductor 156 not only makes electrical contact to substrate 30 but also makes electrical contact to region 154 to provide the electrical connection to the anode of diode 25 or alternately to the anode of diode 125. This facilitates packaging TVS 150 in a chip scale package that only allows connections to one surface of a semiconductor device.

From all the foregoing, one skilled in the art will appreciate that an example of an embodiment of a TVS semiconductor device may comprise:

a first terminal, such as for example I/O terminal 21, of the TVS semiconductor device configured to be coupled to one of a data line or a common line;

a second terminal, such as for example common terminal 22, of the TVS semiconductor device configured to be coupled to a different one of the data line or the common line;

a P-N diode, such as for example diode 25 or 125, having an anode coupled to the second terminal) an having a cathode coupled to the first terminal; and a bipolar transistor, such as for example transistor 26 or 126, having a first current carrying electrode coupled to the first terminal, a second current carrying electrode coupled to the second terminal, and a base electrode that is floating and is not directly coupled to an electrical potential.

An embodiment may include that the bipolar transistor may be an NPN transistor having a collector directly connected to both the cathode and the first terminal, and having an emitter directly connected to the anode.

In an embodiment, the bipolar transistor may be a PNP transistor having a collector directly connected to both the anode and the second terminal, and having an emitter directly connected to the cathode.

Another embodiment may include that the TVS semiconductor device may be formed on a semiconductor substrate that is devoid of other active circuit elements.

In an embodiment, the TVS semiconductor device may be formed on a semiconductor substrate of a first conductivity type having a first semiconductor region of a second conductivity type formed on the semiconductor substrate; and a first isolation structure surrounding a first portion of the first semiconductor region wherein an interface between the first portion and the semiconductor substrate forms the P-N diode.

Another embodiment may include a second isolation structure surrounding a second portion of the first semiconductor region;

a second semiconductor region of the first conductivity type formed within the second portion of the first semiconductor region; and a third semiconductor region of the second conductivity type formed within the second semiconductor region wherein the semiconductor substrate forms a collector region of the bipolar transistor, the second portion of the first semiconductor region forms the base electrode of the bipolar transistor, and the third semiconductor region forms an emitter region of the bipolar transistor.

In an embodiment, a breakdown voltage of the P-N diode may be greater than an open base collector-to-emitter breakdown voltage of the bipolar transistor (BVeco).

Those skilled in the art will also appreciate that an example of an embodiment of a TVS semiconductor device may comprise:

a semiconductor substrate of a first conductivity type having a first doping concentration, the semiconductor substrate connected to a first terminal, for example one of terminals 21 or 22, of the TVS semiconductor device, the semiconductor substrate forming a first current carrying electrode of a bipolar transistor;

a first semiconductor region, such as for example region 31, of a second conductivity type having a second doping concentration that is less than the first doping concentration;

a first isolation structure, such as for example region structure 35, surrounding a first portion, such as for example portion 37, of the first semiconductor region wherein an interface between the semiconductor substrate and the first portion of the first semiconductor region forms a P-N diode;

a second isolation structure, such as for example structure 47, surrounding a second portion of the first semiconductor region and isolating the second portion of the first semiconductor region from the first portion of the first semiconductor region, the second portion of the first semiconductor region forming a base region of the bipolar transistor; and a second semiconductor region, such as for example region 39, of the first conductivity type formed in the second portion of the first semiconductor region and the second semiconductor region, the second semiconductor region commonly connected to the second portion of the first semiconductor region and to a second terminal, such as for example one of terminals 22 or 21, of the TVS semiconductor device, the second semiconductor region forming a second current carrying electrode of the bipolar transistor.

Another embodiment may include that the TVS semiconductor device is devoid of a Zener diode.

An embodiment may also include a third semiconductor region, such as for example region 41, of the second conductivity type formed within the second semiconductor region.

Another embodiment may include that the P-N diode may be connected in parallel between a collector and an emitter of the bipolar transistor, and wherein a base of the bipolar transistor is not directly connected to an electrical potential.

The TVS semiconductor device may also have an embodiment that may include a contact trench external to the second isolation structure and extending from a surface of the first semiconductor region through the first semiconductor region and exposing a portion of the semiconductor substrate; and a conductor on the exposed portion of the semiconductor substrate, extending along an exposed portion of the first semiconductor region and electrically contacting the first portion of the first semiconductor region.

In an embodiment, the second conductivity type may be P-type, the second doping concentration is between approximately 1E17 and approximately 1E18, and a thickness of the first semiconductor region is greater than a depth of a depletion region formed during operation.

An embodiment may include that the second conductivity type is P-type, the second doping concentration is between approximately 3E15 and approximately 3E16, and a thickness of the first semiconductor region is no less than approximately twenty microns.

Another embodiment may include that the second conductivity type is N-type, the second doping concentration is between approximately 1E17 and approximately 1E18, and a thickness of the first semiconductor region is greater than a depth of a depletion region formed during operation of the TVS.

Those skilled in the art will appreciate that an example of an embodiment of a method of forming a TVS semiconductor device may comprise:

forming a P-N diode connected in parallel between a collector and an emitter of a bipolar transistor wherein a base of the bipolar transistor is floating and not directly connected externally to the bipolar transistor;

forming a reverse breakdown voltage of the P-N diode to be greater than an open base collector-to-emitter breakdown voltage of the bipolar transistor.

An embodiment of the method may also include forming an anode of the P-N diode commonly connected to a first current carrying electrode of the bipolar transistor and to a first terminal of the TVS semiconductor device, and forming a cathode of the P-N diode commonly connected to a second current carrying electrode of the bipolar transistor and to a second terminal of the TVS semiconductor device.

Another embodiment of the method may include forming an anode of the P-N diode commonly connected to an emitter of the bipolar transistor and to a first terminal of the TVS semiconductor device, and forming a cathode of the P-N diode commonly connected to a collector of the bipolar transistor and to a second terminal of the TVS semiconductor device.

An embodiment may also include providing a semiconductor substrate;

forming the P-N diode and the bipolar transistor on the semiconductor substrate, and forming on the semiconductor substrate two or more other P-N diodes connected in parallel between a collector and an emitter of corresponding two or more other bipolar transistors wherein a base of each the two or more other bipolar transistors is floating and not directly connected externally to the two or more other bipolar transistors.

Another embodiment may also include forming the P-N diode and the bipolar transistor in a semiconductor region having a first conductivity type that is overlying a substrate of a second conductivity type, the P-N diode formed in a first portion of the semiconductor region and the bipolar transistor formed in a second portion of the first semiconductor region that is isolated from the first portion of the first semiconductor region.

In view of all of the above, it is evident that a novel device and method is disclosed. Included, among other features, is forming a P-N diode in parallel with a bipolar transistor wherein a BVeco voltage of the bipolar transistor is less than a reverse breakdown voltage of the P-N diode. This facilitates forming the TVS to have a positive clamp voltage that is controlled by the bipolar transistor, such as for example the BVeco of the bipolar transistor, and also allows a TVS to have a reverse or negative breakdown voltage is controlled by the forward voltage of the P-N diode. In an additional alternate embodiment, forming the P-N diode on a semiconductor substrate and in a first isolated portion of a semiconductor region and forming the bipolar transistor on the semiconductor substrate and in a second isolated portion of the semiconductor region facilitates confining the current from the positive transient event to flow through the bipolar transistor. The isolation assist in forming the positive clamp voltage of TVS 20 to be controlled substantially by the positive breakdown voltage of transistor 26 and in forming the negative clamp voltage of TVS 20 to be controlled substantially by the forward voltage of diode 25. During high current transient events with either polarity, the concurrent conduction of both transistor 26 and diode 25 assists in reducing the on-resistance of TVS 20 which assist in minimizing the clamp voltage for high current operations. In an embodiment, TVS 20 may have a positive clamp voltage (at a given current) that may be approximately one-half of the clamp voltage of prior TVS devices. Since an embodiment of TVS 20 is formed such that transistor 26 is not conducting for the range of working voltages, TVS 20 has a lower leakage current than prior TVS devices.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of TVS 20 and 120 are used as a vehicle to explain an example of a method of forming the TVS.

Those skilled in the art will appreciate that although only one TVS is illustrated as being formed on substrate 30 (such as for example only one TVS 20 or 120 or 138 or 150), the device may include multiple versions of the TVS formed on substrate 30 and isolated from each other by isolation structures, such as for example structures 35 and 47. For example, an embodiment may include that connector 11 may include a plurality wires and that each wire may need to be protected by a TVS device. In such a system, the device with multiple TVSs can have a separate TVS I/O terminal connected to each of the separate wires. In an embodiment, the multiple TVS may all have a common connection formed by substrate 30. For example, each multiple TVS 20 could have multiple diodes 25 wherein all the cathodes are commonly connected together. Similarly, each multiple TVS 120 could have multiple diodes 125 wherein all the anodes are commonly connected together.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a transient voltage suppressor (TVS) semiconductor device comprising:

forming a P-N diode connected in parallel between a collector and an emitter of a bipolar transistor wherein a base of the bipolar transistor is floating and not directly connected externally to the bipolar transistor; and forming a thickness of a first current carrying electrode of the P-N diode to be greater than a total thickness of the base of the bipolar transistor wherein a reverse breakdown voltage of the P-N diode is to be greater than an open base collector-to-emitter breakdown voltage of the bipolar transistor (BVeco).

2. The method of claim 1 including forming an anode of the P-N diode commonly connected to one of the collector or the emitter of the bipolar transistor and to a first terminal of the TVS semiconductor device, and forming a cathode of the P-N diode commonly connected to a different one of the collector or the emitter of the bipolar transistor and to a second terminal of the TVS semiconductor device.

3. The method of claim 1 including forming an anode of the P-N diode commonly connected to the emitter of the bipolar transistor and to a first terminal of the TVS semiconductor device, and forming a cathode of the P-N diode commonly connected to the collector of the bipolar transistor and to a second terminal of the TVS semiconductor device.

4. The method of claim 1 including forming at least a portion of the P-N diode and at least a portion of the bipolar transistor in a semiconductor region having a first conductivity type that is overlying a substrate of a second conductivity type, wherein the portion of the P-N diode is a first portion of the semiconductor region and the portion of the bipolar transistor is a second portion of the semiconductor region that is isolated from the first portion of the semiconductor region.

5. The method of claim 1 further including forming a semiconductor region having a first conductivity type including forming the semiconductor region overlying a substrate of a second conductivity type;

forming the first current carrying electrode of the P-N diode as a first portion of the semiconductor region; and forming the base of the bipolar transistor as a second portion of the semiconductor region.

6. The method of claim 5 further including forming an isolation region between the first portion of the semiconductor region and the second portion of the semiconductor region.

7. The method of claim 1 further including forming the base to be a first portion of a first doped region that has a first conductivity type and forming the first current carrying electrode to be a second portion of the first doped region.

8. A method of forming a transient voltage suppressor (TVS) semiconductor device comprising:

forming a P-N diode connected in parallel between a collector and an emitter of a bipolar transistor wherein a base of the bipolar transistor is floating and not directly connected externally to the bipolar transistor; and forming a thickness of a first current carrying electrode of the P-N diode to be greater than a thickness of the base of the bipolar transistor including forming the base as a first doped region having a first doping concentration and forming the emitter as a second doped region having a second doping concentration that is less than the first doping concentration wherein the second doped region overlies the first doped region wherein a reverse breakdown voltage of the P-N diode is to be greater than an open base collector-to-emitter breakdown voltage of the bipolar transistor (BVeco).

9. A method of forming a transient voltage suppressor (TVS) semiconductor device comprising:
providing a substrate of a first conductivity type;
forming a doped region of a second conductivity type on the substrate;
forming at least a portion of a bipolar transistor in a first portion of the doped region wherein a base of the bipolar transistor is floating and not directly connected externally to the bipolar transistor, and wherein a collector-base junction of the bipolar transistor is formed at an interface between the substrate and the first portion of the doped region;
forming a least a portion of a diode in a second portion of the doped region wherein a total thickness of the second portion is substantially the same as a total thickness of the first portion, and wherein a P-N junction of the diode is formed at an interface between the substrate and the second portion of the doped region; and
forming the diode connected in parallel between a collector and an emitter of the bipolar transistor.

10. The method of claim 9 further including forming a first doping concentration of the first portion of the doped region to be substantially the same as a second doping concentration of the second portion of the doped region.

* * * * *